(12) United States Patent
Akamatsu

(10) Patent No.: US 7,791,402 B2
(45) Date of Patent: Sep. 7, 2010

(54) ELECTRIC FUSE DETERMINATION CIRCUIT AND DETERMINATION METHOD

(75) Inventor: Hiroshi Akamatsu, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/289,588

(22) Filed: Oct. 30, 2008

(65) Prior Publication Data

US 2009/0115493 A1    May 7, 2009

(30) Foreign Application Priority Data

Nov. 2, 2007  (JP)  ............................ P2007-286414

(51) Int. Cl.
*H01H 37/76*  (2006.01)
(52) U.S. Cl. ..................................... 327/525
(58) Field of Classification Search ................ 327/524, 327/525
See application file for complete search history.

(56) References Cited

U.S. PATENT DOCUMENTS

| 5,387,823 | A | * | 2/1995 | Ashizawa | ..................... 326/13 |
| 5,889,414 | A | * | 3/1999 | Li et al. | ......................... 326/49 |
| 6,686,790 | B2 | * | 2/2004 | Cutter et al. | ................. 327/525 |
| 7,567,114 | B2 | * | 7/2009 | Matsubara | ................... 327/525 |

* cited by examiner

*Primary Examiner*—Jeffrey S Zweizig
(74) *Attorney, Agent, or Firm*—McGinn IP Law Group, PLLC

(57) ABSTRACT

An electrical fuse determination circuit that can speedily and reliably incorporate an electrical fuse data and improve a reliability of electrical fuse device, includes a first electrical fuse device of which one end connects with a higher voltage, a second electrical fuse device of which one end connects with a lower voltage, a set portion that puts one of the first electrical fuse device and the second electrical fuse device in a conductive state, and a determination portion that determines a voltage level of a predetermined contact point connecting the other end of the first electrical fuse device and the other end of the second electrical fuse device.

7 Claims, 4 Drawing Sheets

ELECTRIC FUSE DETERMINATION CIRCUIT AND DETERMINATION METHOD

BACKGROUND OF THE INVENTION

1. Field of the Invention

The present invention relates to an electrical fuse determination circuit and a determination method that are preferably employed in a semiconductor memory and a semiconductor device having the semiconductor memory.

Priority is claimed on Japanese Patent Application No. 2007-286414, filed Nov. 2, 2007, the content of which is incorporated herein by reference.

2. Description of Related Art

In a conventional semiconductor memory, when a memory cell of a failure operation is detected during a test process before a product delivery, the circuit operation is generally switched to the operation that uses a preliminary memory cell (redundancy cell). In this operation of switching to a redundancy cell, it is generally carried out that a laser beam is irradiated to a preformed circuit line for fusing so as to take fusion cutting of the circuit line of a wafer before package assembly. Since this fusion cutting of the circuit line for fusing can be achieved only before package assembly, an electrical fuse that can change the circuit operation even after package assembly has been used in recent semiconductor memory (alternately, the cutting fuse by the laser beam and the electrical fuse are used together).

The electrical fuse is called an anti fuse, and is a non-conductive device in the initial state and composed of an insulator sandwiched between two electrodes. When a high voltage is applied between the two electrodes of the electrical fuse device, the insulator is broken down. Thereby, the electrodes connect (short) with each other so as to assume the conductive state. Accordingly, even after package assembly, it is possible to change the desired electrical fuse into the connecting (conductive) state through inputting a specific signal from the outside. Therefore, even when a failure cell is detected after package assembly, it is possible to plan an enhancement of the yield by using the electrical fuse and substituting the redundancy cell.

Connect information, in which whether a plurality of the electrical fuses provided in the semiconductor device assumes the conductive or non-conductive state, is incorporated into the device inside by a determination circuit when the power supply turns on, the specific circuit operation occurs based on the connect information.

FIG. 3 shows an example of an electric fuse determination circuit according to a related art. This circuit is assumed to be formed in a synchronous dynamic random access memory (DRAM). Reference symbols 21 through 27 correspond to a p-channel metal oxide semiconductor (PMOS) transistor, reference symbols 28 through 34 correspond to an n-channel metal oxide semiconductor (NMOS) transistor, and reference symbols 35 and 36 correspond to an electrical fuse device. A signal Vpp_ov normally corresponds to a Vdd level (power supply voltage level), while the signal Vpp_ov is higher than the Vdd level when the electrical fuse assumes the conductive state. A signal Vbb_ud normally corresponds to a Vss level (ground voltage level), while the signal Vbb_ud is lower than the Vss level when the electrical fuse assumes the conductive state. A control signal STORE puts the electrical fuse in the conductive state, a control signal LOAD incorporates electrical fuse data, a reference voltage is a voltage of middle level lower than the Vdd level, a node A corresponds to a contact node of the electrical fuse device, and a control signal PRE precharges the node A with the Vdd, Subsequently, the connect operation of the electrical fuse will be described hereinbelow. In the case of the electrical fuse being connected, the signal STORE is placed into an "L" state so that the Vpp_ov and the Vbb_ud levels are applied to both contact points of the electrical fuse devices 35 and 36. Thereby, the electrical fuse devices 35 and 36 are broken down so as to assume the conductive state.

Then, the incorporate operation of the electrical fuse data will be described hereinbelow. The signal PRE generates a one-shot "L" pulse through a mode register set command MRS. By this one-shot pulse, the PMOS transistor 27 is turned on and the node A is precharged with the Vdd. When the signal PRE is placed into an "H" state, the node A is pulled down to the Vss level through the electrical fuse devices 35 and 36. After a predetermined period elapses from the signal PRE being placed into an "H" state, one-shot pulse of the signal LOAD is generated. By this one-shot pulse of the signal LOAD, levels of the node A and the reference voltage are compared, the determination result is output, and hence, the electrical fuse data is incorporated.

Subsequently, an operation of the electrical fuse determination circuit will be described hereinbelow. FIG. 4 shows a timing chart after the command MRS of the electrical fuse determination circuit shown in FIG. 3 is input. A reference symbol CK corresponds to an external clock signal CLK. The one-shot pulses of the signal PRE and the signal LOAD are generated within 2 clock periods (tMRD=2CLK) after the command MRS is input. The level of the node A is precharged with the Vdd through the signal PRE. After that, the level of the node A is decrease. The one-shot pulse of the signal LOAD is generated when the level of the node A becomes lower than the reference voltage. A determination circuit made of the NMOS transistors 32, 33, 34, and the like, outputs a determination result, in which the level of the node A is lower than the reference voltage, so as to incorporate the electrical fuse data.

When the insulator used in the electrical fuse device is broken down through the high voltage applied to the electrical fuse device so as to assume the conductive state, the electrical resistance value thereof under conductive state frequently fluctuates. Therefore, for example, as shown in FIG. 3, a circuit is provided that includes two electrical fuse devices connected in parallel having the same configuration and further includes the same circuit portions that apply the high voltage. When the electrical fuse device assumes the conductive state, both electrical fuse devices connected in parallel assume the conductive state. In this manner, the fluctuation of the electrical resistance value is suppressed.

However, as with the dotted line shown in FIG. 4, since the resistance of the electrical fuse is high, even if the level of the node A does not decrease below the reference voltage during the period from the signal PRE being placed into an "H" state to the signal LOAD being placed into an "H" state, the determination circuit outputs the determination result, in which the level of the node A is higher than the reference voltage, so as to fail to incorporate the electrical fuse data. Since there is only a period of the 2CLK from the command MRS to a bank active command ACT, a timing margin becomes small if the resistance of the electrical fuse is high under conductive state.

Therefore, according to the electrical fuse determination method, when the resistance of the electrical fuse becomes high under conductive state due to the fluctuation thereof during the production, the conductive state of the electrical fuse cannot be determined, and hence, there has been a problem in which the semiconductor device does not operate as desired (substituting a redundancy cell, and the like). As a result, there has been a problem that decreases the yield of the semiconductor device during the production.

In FIG. 3, the reference symbol tMRD corresponds to a load mode command cycle time, and the reference symbol tRCD corresponds to an active command read/write command delay. The reference symbol WR/RD indicates the read/write command. The NMOS transistors 32 and 33 compose an input portion of a comparator circuit taking the reference voltage as a reference level thereof. The PMOS transistors 25 and 26 are controlled to turn off when the electrical fuse devices 35 and 36 assume the conductive state (during programming), while the PMOS transistors 25 and 26 are controlled to turn on when the electrical fuse data is incorporated. The PMOS transistors 25 and 26 are employed to disconnect from the other electrical fuse device and the circuit when the electrical fuse device assumes conductive state.

The prior art is disclosed in Published Japanese translation of a PCT application No. 2000-512059, and Japanese Unexamined Patent Application, First Publication, No. 2001-067893 and No. 2006-339290.

Then are several problems in the electrical fuse determination circuit.

A first problem is that the incorporation of the electrical fuse data takes an error, when the resistance of the electrical fuse cannot be decreased enough. The reason for this problem is attributed to a time limitation from the command MRS to the command ACT, since the electrical fuse data is incorporated by the command MRS.

Conventionally, at the time of inputting the command MRS, the node connecting with the electrical fuse device (node A shown in FIG. 3) starts precharging so as to pull up the voltage thereof to the Vdd level. Then, if the electrical fuse device assumes the conductive state, the voltage of the node decreases to the Vss level. When the conductive resistance of the electrical fuse device is higher than a predetermined value, the voltage of the node does not decrease enough until the time of determining the node state so as to take an error of determination.

A second problem is that the reliability of the electrical fuse device is degraded in use. The reason for this problem is attributed to the electrical fuse device assuming the conductive state pulling down the node A to the Vss level after precharging to the Vdd level while incorporating data thereof, and hence, the current flows through the electrical fuse device.

The electrical fuse device, which assumes the conductive state, conducts through a current path like a pin hole formed by breaking the insulator down. Thereby, the current density is much higher than that in the conventional circuit line. Accordingly, even if the current keeps flowing, the current path formed is cut off due to the current stress, or the conductive resistance of the electrical fuse device increases. Therefore, the decreased reliability is apprehended in the conventional electrical fuse device.

Although an occurrence of the deficiency which is caused by the problems described above is suppressed through two electrical fuse devices connected in parallel to assume the same conductive state in the prior art, that is not the complete countermeasure.

SUMMARY

The present invention seeks to solve one or more of the above problems, or to improve those problems at least in part.

In one embodiment, there is provided an electrical fuse determination circuit that includes a first electrical fuse device in which one end connects with a higher voltage, a second electrical fuse device in which one end connects with a lower voltage, a set portion that puts one of the first electrical fuse device and the second electrical fuse device in a conductive state, and a determination portion that determines a voltage level of a predetermined contact point connecting the other ends of the first electrical fuse device and the second electrical fuse device.

In one embodiment, there is provided an electrical fuse determination method that includes preparing a first electrical fuse device in which one end connects with higher voltage, and a second electrical fuse device in which one end connects with a lower voltage, putting one of the first electrical fuse device or the second electrical fuse device in a conductive state, and determining a voltage level of a predetermined contact point connecting the other ends of the first and second electrical fuse devices.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE INVENTION

Figure 3:
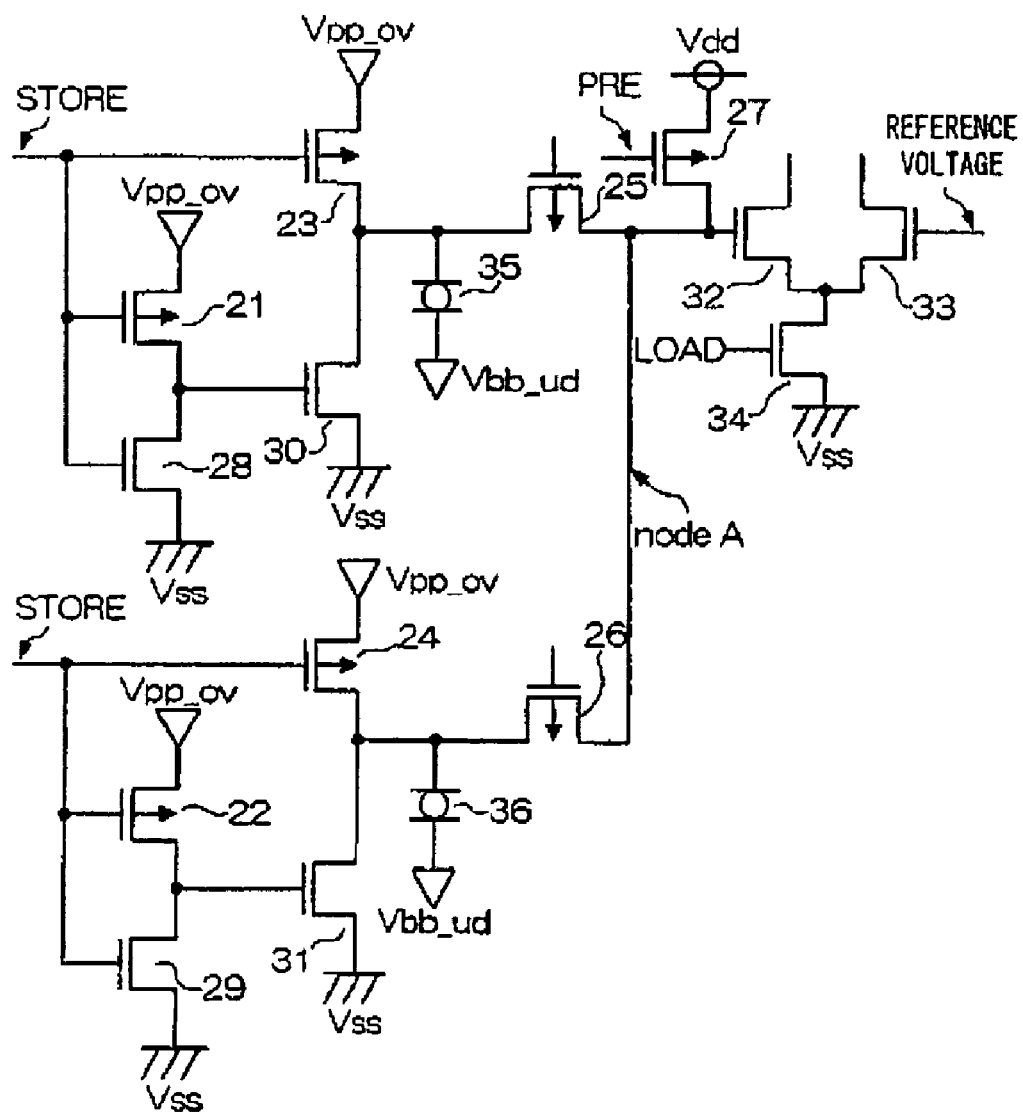
FIG. 3 is a circuit diagram that shows a configuration of an electric fuse determination circuit according to a related art of the present invention.
Figure 4:
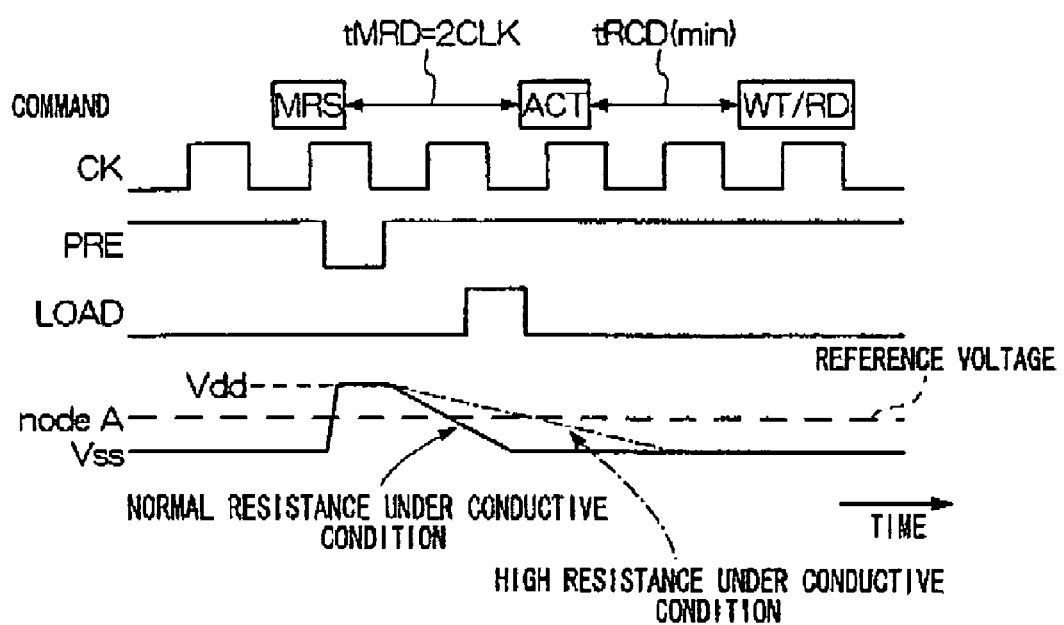
FIG. 4 is a timing chart that shows an operation of the electric fuse determination circuit shown in FIG. 3.

The invention will be described herein with reference to illustrative embodiments. Those skilled in the art will recognize that many alternative embodiments can be accomplished using the teachings of the present invention and that the invention is not limited to the embodiments illustrated here for explanatory purposes. The explanation of reference symbols as described above with reference to FIG. 3 will be omitted from the following description. It is assumed that the electrical fuse determination circuit of the present invention is formed in a synchronous DRAM.

Figure 1:
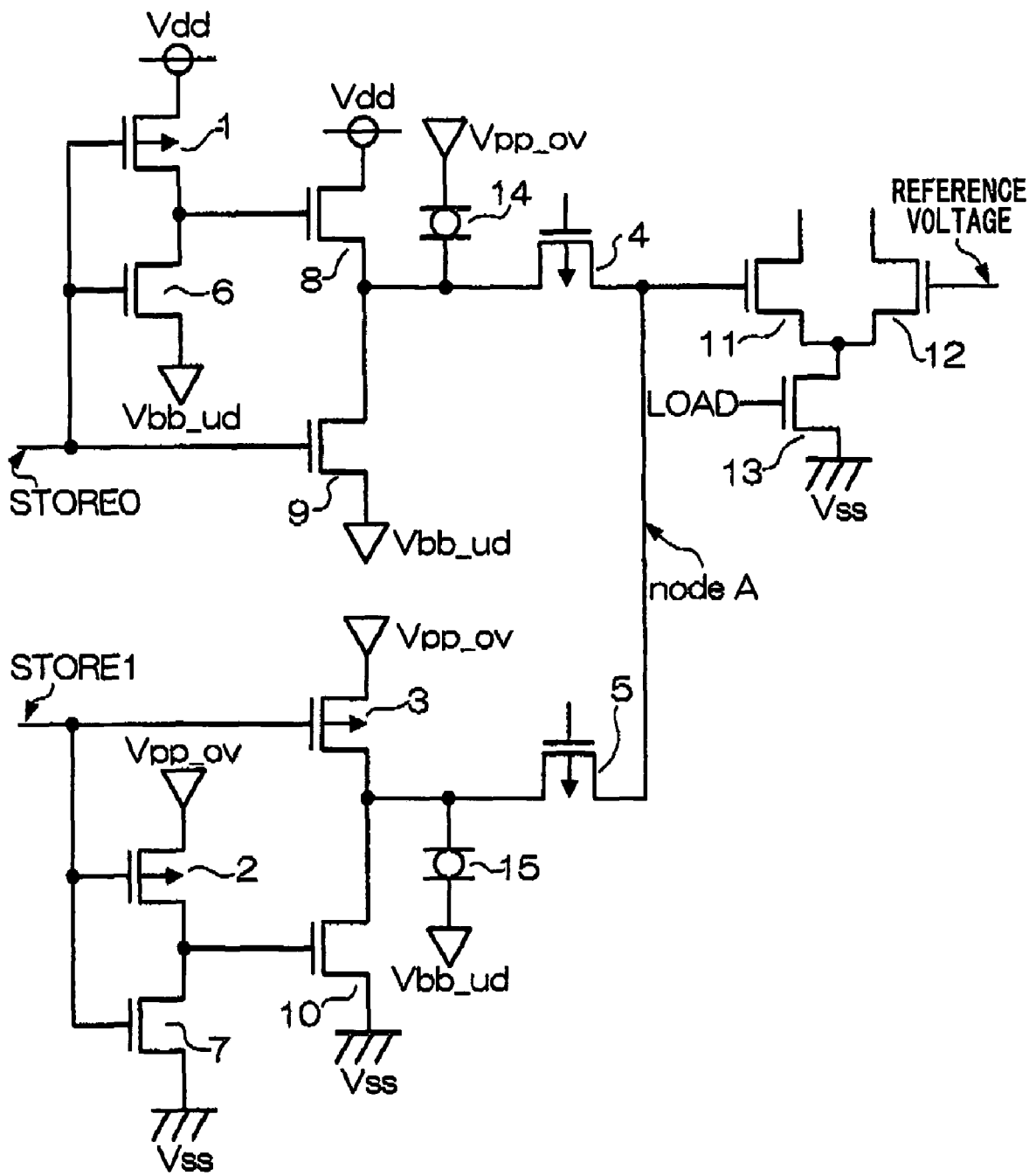
FIG. 1 is a circuit diagram that shows a configuration of an electric fuse determination circuit according to an embodiment of the present invention.

FIG. 1 shows an electric fuse determination circuit according to an embodiment of the present invention. Reference symbols 1 through 5 correspond to a PMOS transistor, reference symbols 6 through 13 correspond to a NMOS transistor, reference symbols 14 and 15 correspond to an electrical fuse device. A signal Vpp_ov normally corresponds to a Vdd level, while the signal Vpp_ov is higher than the Vdd level when the electrical fuse assumes the conductive state. A signal Vbb_ud normally corresponds to a Vss level, while the signal Vbb_ud is lower than the Vss level when the electrical fuse assumes the conductive state. Control signals STORE0 and STORE1 put the electrical fuse in the conductive state, a control signal LOAD incorporates an electrical fuse data, a reference voltage is a voltage of middle level lower than the Vdd level, and a node A corresponds to a contact node of the electrical fuse device.

The electrical fuses 14 and 15 are non-conductive devices in the initial state and composed of an insulator sandwiched between two electrodes. When a high voltage is applied between the two electrodes of the electrical fuse device, the insulator is broken down. Thereby, the electrodes connect (short) with each other so as to assume the conductive state.

The PMOS transistor 1 and the NMOS transistor 6 compose an inverter circuit that inverts the signal STORE0 and outputs the Vdd or Vbb_ud level, so as to control the NMOS transistor 8, whose source connects with the signal Vdd, to turn on or off. The NMOS transistor 9, whose drain and source connect with a source of the NMOS transistor 8 and the signal Vbb_ud, respectively, is controlled to turn on or off by the signal STORE0 input to a gate thereof. A contact point of the NMOS transistor 8 and the NMOS transistor 9 connects with one end of the electrical fuse device 14 and the PMOS transistor 4. The other end of the electrical fuse device 14 connects with the signal Vpp_ov. The voltage of the Vdd level is normally applied to the other end of the electrical fuse device 14, while the voltage higher than the Vdd level is applied when the electrical fuse assumes the conductive state.

On the other hand, the PMOS transistor 2 and the NMOS transistor 7 compose the inverter circuit that inverts the signal STORE1 and outputs with setting to the Vpp_ov or Vss level, so as to control the NMOS transistor 10, whose source connects with the signal Vss, to turn on or off. The PMOS transistor 3, whose drain and source connect with a drain of the NMOS transistor 10 and the signal Vpp_ov, respectively, is controlled to turn on or off by the signal STORE1 input to a gate thereof. The contact point of the PMOS transistors 3 and the NMOS transistor 10 connects with one end of the electrical fuse device 15 and the PMOS transistor 5. The other end of the electrical fuse device 15 connects with the signal Vdd_ud. The other end of the electrical fuse device 15 is normally applied the voltage of the Vss level, while the lower voltage than the Vss level is applied when the electrical fuse assumes the conductive state.

A terminal of the PMOS transistor 4 (node A side), which does not connect with the electrical fuse device 14, connects with a terminal of the PMOS transistor 5 (node A side), which does not connect with the electrical fuse device 15. The terminals of the PMOS transistors 4 and 5 connecting each other further connect with a gate of the NMOS transistor 11. The PMOS transistors 4 and 5 are controlled to turn off when the electrical fuse devices 14 and 15 assume the conductive state (during setting), while the PMOS transistors 4 and 5 are controlled to turn on when the electrical fuse data is incorporated.

A source of the NMOS transistor 11 connects with a source of the NMOS transistor 12 and a drain of the NMOS transistor 13. When the signal LOAD, which inputs to a gate of the NMOS transistor 13 is placed into an "H" state, the NMOS transistor 11 turns on if the gate voltage of the NMOS transistor 11 is higher than the reference voltage input in a gate of the NMOS transistor 12, while the NMOS transistor 11 turns off if the gate voltage of the NMOS transistor 11 is lower than the reference voltage input in the gate of the NMOS transistor 12. A source of the NMOS transistor 13 connects with the ground voltage Vss. Drains of the NMOS transistor 11 and the NMOS transistor 12 connect with an unillustrated load circuit in which the power supply is set to the Vdd.

Subsequently, the connect operation of the electrical fuse will be described hereinbelow. In order to write an "L" level to the node A, the signal STORE1 is placed into an "L" state so as to turn on the NMOS transistor 3, the Vpp_ov and Vbb_ud levels are applied to both contact points of the electrical fuse device 15. Thereby, the electrical fuse device 15 is broken down so as to conduct to the Vdd_ud. On the other hand, in order to write an "H" level to the node A, the signal STORE0 is placed into an "H" state so as to turn on the PMOS transistor 9, the Vpp_ov and Vbb_ud levels are applied to both contact points of the electrical fuse device 14. Thereby, the electrical fuse device 14 is broken down so as to conduct to the Vpp_ov. The NMOS transistor 10 and the NMOS transistor 8 are used as a resistance load when the high voltage is applied.

A feature of the present invention is that only one of the two electric fuse devices connected in parallel reliably assumes the conductive conduction in advance, based on the state of the node A.

Subsequently, the incorporate operation of the electrical fuse data will be described hereinbelow. After the power supply turns on, the Vpp_ov is set to the Vdd level, the Vbb_ud is set to the Vss level, and the reference voltage is set to the voltage of middle level lower than the Vdd level. The PMOS transistor 4 and the PMOS transistor 5 turn on. At this time, the contact points of the electrical fuse devices 14 and the electrical fuse devices 15 (counter terminal to the terminal connecting with the signal Vpp_ov or the signal Vbb_ud) are set to the predetermined levels (the Vdd level or the Vss level), and the node A is also set to the predetermined level (the Vdd level or the Vss level). That is, for example, if the electrical fuse device 14 is open and the electrical fuse device 15 is short, the node A is set to the Vss level after the power supply turns on. On the other hand, if the electrical fuse device 14 is short and the electrical fuse device 15 is open, the node A is set to the Vdd level after the power supply turns on.

Then, when the command MRS is input, the one-shot pulse of the signal LOAD is generated. Since the NMOS transistor 13 turns on by this one-shot pulse of the signal LOAD, the levels of the node A and the reference voltage are compared so as to output the determination result, and hence, the electrical fuse data is incorporated.

Figure 2:
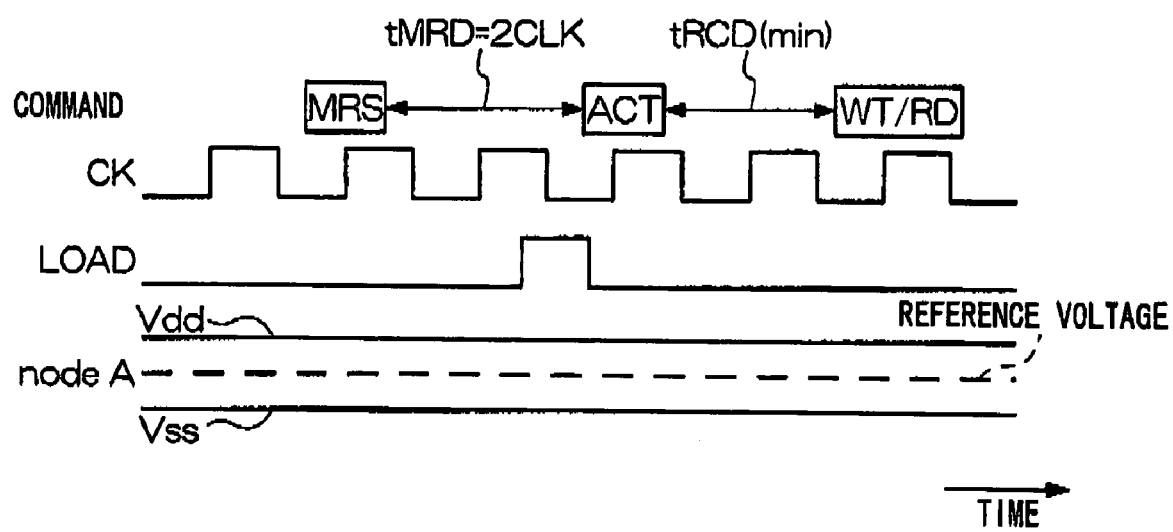
FIG. 2 is a timing chart that shows an operation of the electric fuse determination circuit shown in FIG. 1.

Subsequently, an operation of the electrical fuse determination circuit will be described hereinbelow. FIG. 2 shows a timing chart after the command MRS of the electrical fuse determination circuit shown in FIG. 1 is input. A reference symbol CK corresponds to an external clock signal CLK. The one-shot pulse of the signal LOAD is generated within 2 clock periods (tMRD=2CLK) after the command MRS is input. The node A is charged with the predetermined level during the period from the power supply turning on to the command MRS being input. Therefore, when the one-shot pulse of the signal LOAD is generated, the level of the node A is set to the sufficient level for an "L" or an "H" as compared to the reference voltage. When the determination circuit operates by the signal LOAD, since a voltage difference between the reference voltage and the node A is large enough, the determination circuit can reliably determine the level of the node A, and hence, the electrical fuse data is incorporated.

Subsequently, advantages according to the embodiment of the present invention will be described hereinbelow.

A first advantage according to the embodiment of the present invention is that the incorporation of the electrical fuse data can speedily and reliably be achieved. The reason is that voltage locking (voltage determining) is completed when the power supply turns on. That is, only one of the two electric fuse devices connected in parallel reliably assumes the conductive conduction in the present invention. For this reason, it is possible to lock (determine) the voltage of the node used for determining the electrical fuse device just after the power supply turns on, in response to the voltage of the contact point of the electrical fuse device assuming the conductive state.

A second advantage according to the embodiment of the present invention is that the reliability of the electrical fuse device can be improved. The reason is due to the circuit configuration in which the current does not flow in the electrical fuse device. That is, in the present invention, the circuit operation, which pulls the electric charge from the node portion precharged with the Vdd level and has been essential in the previous configuration, is not necessary, and hence, it is possible to suppress that the current stress applies to the electrical fuse device.

Subsequently, another embodiment of the present invention will be described hereinbelow. The electrical fuse determination circuit of the present invention is not limited for usage only in the semiconductor memory such as DRAM and the like. That is, if a semiconductor device has the electrical fuse device and performs the predetermined circuit operation using the conductive state thereof when the power supply turns on, a general logic product and the like can be similarly used.

Alternately, if the electrical fuse device used is made to assume the conductive state through the insulate film being broken down, materials of the electrode and the insulate film and the structure thereof are not especially limited, and can be used in the electrical fuse device. For example, as a specific electrical fuse device, there is a type in which the electrodes are made of the gate electrode of the transistor and the semiconductor substrate, and the gate insulate film therebetween is broken down. When used in a DRAM, a type, in which the capacitive insulate film provided between the capacitive electrode of the capacitor is broken down, can be used, The relationship between the constituent elements described in the claims and described in the embodiment is described as follows: a first electrical fuse device which connects with a higher voltage corresponds to the electrical fuse device 14; a second electrical fuse device which connects with a lower voltage corresponds to the electrical fuse device 15; a set portion that puts one of the electrical fuse devices in the conductive state corresponds to a circuit that includes the NMOS transistor 8 and the PMOS transistor 3 and operates through the signal STORE0 or STORE1; a predetermined contact point corresponds to the node A; a determination portion that determines the voltage level corresponds to the determination circuit including NMOS transistors 11, 12 and 13; and a first open/close portion and a second open/close portion correspond to the PMOS transistors 4 and 5, respectively, Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. An electrical fuse determination circuit comprising:
a first electrical fuse device in which one end connects with a higher voltage;
a second electrical fuse device in which one end connects with a lower voltage;
a set portion that puts one of said first electrical fuse device and said second electrical fuse device in a conductive state;
a determination portion that determines a voltage level of a predetermined contact point connecting the other ends of said first electrical fuse device and said second electrical fuse device, a voltage level of said higher voltage being set to be higher than a voltage level of a power supply of said determination portion when said determination portion operates;
a first switching portion that connects or disconnects said other end of said first electrical fuse device and said predetermined contact point; and
a second switching portion that connects or disconnects said other end of said second electrical fuse device and said predetermined contact point.

2. The electrical fuse determination circuit as recited in claim 1, wherein:
said first switching portion and said second switching portion disconnect when said set portion operates; and
said first switching portion and said second switching portion connect when said set portion does not operate.

3. An electrical fuse determination circuit comprising:
a first electrical fuse device in which one end connects with a higher voltage;
a second electrical fuse device in which one end connects with a lower voltage;
a set portion that puts one of said first electrical fuse device and said second electrical fuse device in a conductive state; and
a determination portion that determines a voltage level of a predetermined contact point connecting the other ends of said first electrical fuse device and said second electrical fuse device,
wherein a voltage level of said higher voltage is set to be higher than a voltage level of a power supply of said determination portion when said determination portion operates, and
wherein:
said voltage level of said higher voltage is set to be the same as said voltage level of said power supply of said determination portion when said determination portion does not operate;
a voltage level of said lower voltage is set to be lower than a ground voltage level of said determination portion when said determination portion operates; and
said voltage level of said lower voltage is set to be the same as said ground voltage level of said determination portion when said determination portion does not operate.

4. An electrical fuse determination method comprising:
preparing a first electrical fuse device in which one end connects with higher voltage, and a second electrical fuse device in which one end connects with a lower voltage;
putting one of said first electrical fuse device or said second electrical fuse device in a conductive state; and
determining a voltage level of a predetermined contact point connecting the other ends of said first and second electrical fuse devices,
wherein a voltage level of said higher voltage is set to be higher than a voltage level of a power supply of said determination portion when said determination portion operates, and
wherein said voltage level of said predetermined contact point is set to a predetermined level during the period from a power supply turning on to a mode register set command being input.

5. The electrical, fuse determination method as recited in claim 4, wherein determining said voltage level of said predetermined contact point is carried out after said mode register set command being input.

6. An electrical fuse determination circuit comprising:
a first electrical fuse device in which one end connects with a higher voltage;
a second electrical fuse device in which one end connects with a lower voltage;
a set portion that puts one of said first electrical fuse device and said second electrical fuse device in a conductive state;

a determination portion that determines a voltage level of a predetermined contact point connecting the other ends of said first electrical fuse device and said second electrical fuse device, a voltage level of said higher voltage being set to be higher than a voltage level of a power supply of said determination portion when said determination portion operates; and a switching portion that connects or disconnects said other end of said first electrical fuse device and said predetermined contact point.

7. An electrical fuse determination circuit comprising:

a first electrical fuse device in which one end connects with a higher voltage;

a second electrical fuse device in which one end connects with a lower voltage;

a set portion that puts one of said first electrical fuse device and said second electrical fuse device in a conductive state;

a determination portion that determines a voltage level of a predetermined contact point connecting the other ends of said first electrical fuse device and said second electrical fuse device, wherein a voltage level of said higher voltage is set to be higher than a voltage level of a power supply of said determination portion when said determination portion operates, and wherein the set portion comprises:
　a first circuit which receives a first control signal and is connected to the other end of the first electrical fuse device; and
　a second circuit which receives a second control signal and is connected to the other end of the second electrical fuse device.

* * * * *